United States Patent
Heismann et al.

(10) Patent No.: US 6,934,160 B2
(45) Date of Patent: Aug. 23, 2005

(54) PRINTED CIRCUIT BOARD ARRANGEMENT

(75) Inventors: Björn Heismann, Erlangen (DE); Quirin Spreiter, Erlangen (DE); Helmut Winkelmann, Eggolsheim (DE)

(73) Assignee: Siemens Aktiengesellschaft, Munich (DE)

( * ) Notice: Subject to any disclaimer, the term of this patent is extended or adjusted under 35 U.S.C. 154(b) by 95 days.

(21) Appl. No.: 10/085,302

(22) Filed: Feb. 28, 2002

(65) Prior Publication Data

US 2002/0126460 A1 Sep. 12, 2002

(30) Foreign Application Priority Data

Feb. 28, 2001 (DE) .......................... 101 09 542

(51) Int. Cl.⁷ .............................. H05K 1/00
(52) U.S. Cl. .................. 361/749; 361/750; 174/254
(58) Field of Search ............... 361/749–751, 361/772–774, 792–795; 174/254–258, 260; 257/691, 697; 250/370.09, 370.11; 378/19

(56) References Cited

U.S. PATENT DOCUMENTS

| | | | |
|---|---|---|---|
| 4,675,786 A | | 6/1987 | Mizuko et al. |
| 4,931,134 A | * | 6/1990 | Hatkevitz et al. ............. 216/17 |
| 5,004,639 A | * | 4/1991 | Desai ........................ 428/138 |
| 5,121,297 A | * | 6/1992 | Haas .......................... 361/751 |
| 5,689,091 A | * | 11/1997 | Hamzehdoost et al. ...... 174/255 |
| 5,856,913 A | | 1/1999 | Heilbronner |
| 6,292,529 B1 | * | 9/2001 | Marcovici et al. ............ 378/19 |
| 6,465,882 B1 | * | 10/2002 | Cohn et al. .................. 257/691 |
| 6,658,082 B2 | * | 12/2003 | Okumura et al. ............. 378/19 |
| 6,667,482 B2 | * | 12/2003 | Von Der Haar ........ 250/370.11 |

FOREIGN PATENT DOCUMENTS

| | | |
|---|---|---|
| DE | 36 06 621 | 9/1986 |
| DE | 35 02 744 | 6/1989 |
| DE | 196 17 055 | 6/1997 |
| GB | 2 183 406 | 6/1987 |
| WO | WO 83/03943 | 11/1983 |
| WO | WO 00/79845 | 12/2000 |

* cited by examiner

*Primary Examiner*—Kamand Cuneo
*Assistant Examiner*—Tuan Dinh
(74) *Attorney, Agent, or Firm*—Schiff Hardin LLP

(57) ABSTRACT

A printed circuit board arrangement with a flexible layer arrangement of at least one electrically conductive layer with a large number of conductor tracks lying next to one another and surrounded by electrically isolating layers has at least one printed circuit board firmly connected to a portion of the flexible layer arrangement and accommodating a component. To form a connection between the component and the conductor tracks of the flexible layer, an opening through the printed circuit board to the conductor tracks is provided, which opening may be stepped, so that different conductor tracks and different layers can be reached.

15 Claims, 2 Drawing Sheets

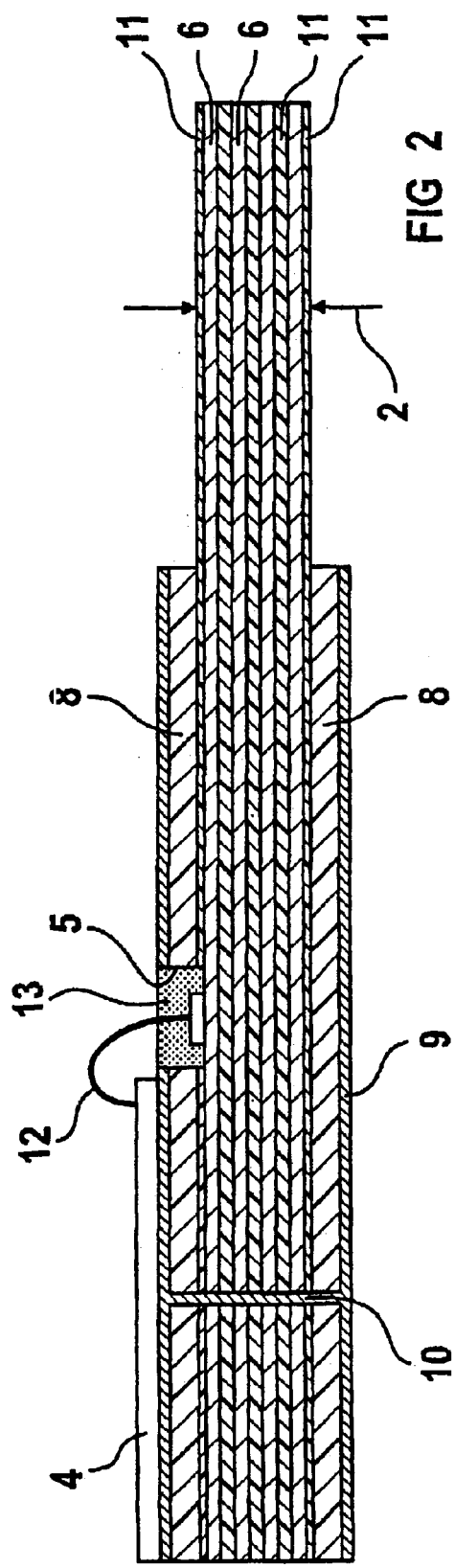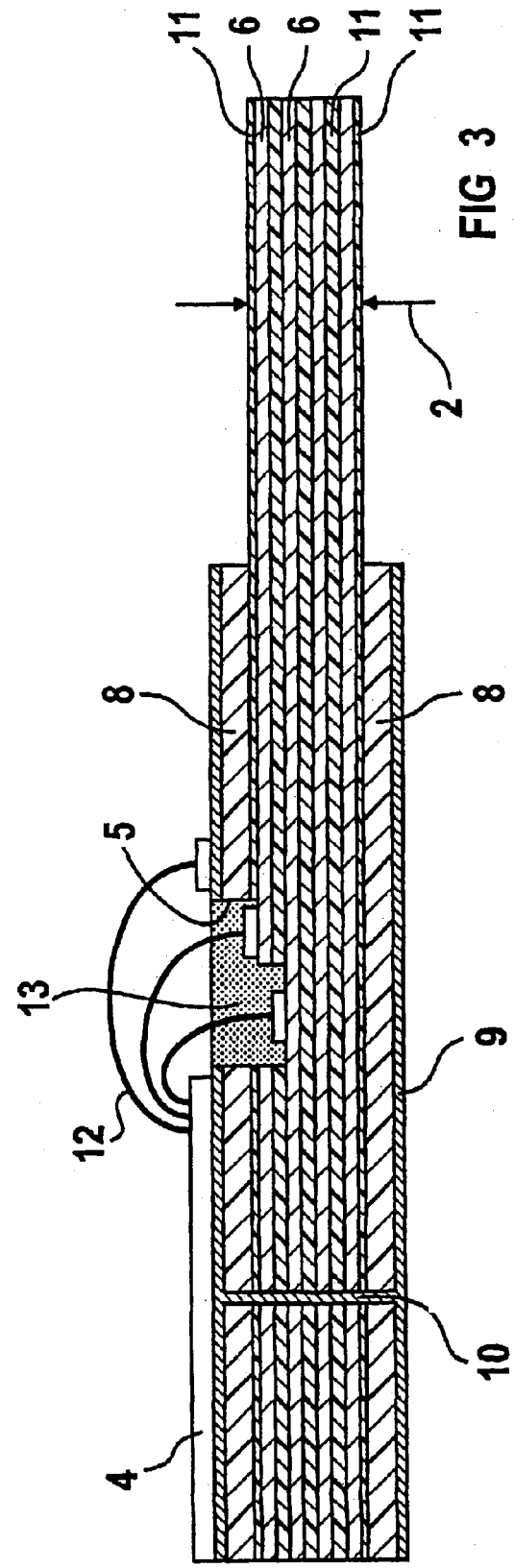

PRINTED CIRCUIT BOARD ARRANGEMENT

BACKGROUND OF THE INVENTION

The present invention is directed to a printed circuit board arrangement having a fixed portion and a flexible layer arrangement containing at least one electrically conductive layer with a large number of conductor tracks lying next to one another and surrounded by electrically isolating layers. The flexible layer arrangement is firmly connected in portions to a fixed portion with at least one printed circuit board suitable for accommodating a component. The fixed portion has at least a clearance or opening extending as far as the conductor tracks.

The invention relates, in particular, to printed circuit board arrangements which are suitable for the connection of a detector module of an X-ray computer tomograph to downstream evaluation electronics.

U.S. Pat. No. 5,856,913, whose disclosure is incorporated herein by reference thereto and which claims priority from German 196 17 055, discloses a generic type of a printed circuit board arrangement. This known printed circuit board arrangement is not suitable for producing a large number of contacts in a very confined space. The conventional bonding method for contacting cannot be used in the case of a printed circuit board arrangement of this type.

According to prior art, there are also known printed circuit board arrangements in which two fixed portions are movably connected to each other by means of a flexible portion. Such printed circuit board arrangements are used, for example, for constructing detector modules for X-ray computer tomographs. In this case, a photodiode array is accommodated on one fixed portion. The individual photodiodes of the photodiode array are connected via conductor tracks accommodated in the flexible portion to a connector mounted on the other fixed portion. The connector, in turn, serves for connecting the detector module to downstream digitizing electronics.

The flexible portion usually comprises a plurality of layers. In this case, at least one of the layers comprises a large number of conductor tracks lying next to one another, which tracks are surrounded by an electrically isolating layer. This layer may be covered on both sides in a manner of a sandwich structure by electrically conducting shielding layers which, in turn, are surrounded by an electrically isolating layer. For forming the fixed portions, the flexible layer structure described above is stiffened by printed circuit boards adhesively attached on its upper side or surface and/or on the underside or surface. Mounted on the printed circuit boards are the respective components. The terminals of these components are connected to the conductor tracks by means of plated through-holes which penetrate the printed circuit boards. Because of the relatively small width of the fixed portions, it is necessary, even in the case of a photodiode array having 16 photodiodes to apply a relatively elongated conductor track structure to the printed circuit board in order for a suitable sheet-like arrangement of the plated through-holes to be created. The provision of such an elongated conductor track structure is detrimental to the shielding.

Detector modules for modern X-ray computer tomographs with multiple row detectors require photodiode arrays with, for example 16×16 photodiodes. The production of 16 times the number of the conventional plated through-holes would require at least 16 times the surface area for the conductor track structure necessary for the connection of the plated through-holes to the terminals. A predetermined overall size of the detector module could no longer be maintained. What is more, such a large surface area of a conductor track structure permitting plated through-hole leads to considerable shielding problems.

UK Patent Application No. 2 183 406, which claims priority from the same U.S. Application as German 36 06 621, describes a flexible layer arrangement which is formed by a sequence of layers of electrically isolating and electrically conductive layers.

WO 83/03943 describes a method of producing a fixed printed circuit board arrangement for producing "bubble memories". In this case, a layer arrangement comprising isolating and conductive layers is applied to a fixed substrate. A contacting link passes through the layer arrangement and reaches the surface of the printed circuit board. The known method does not allow a large number of contacts to be achieved in a very confined space.

SUMMARY OF THE INVENTION

The object of the present invention is to eliminated the disadvantages of the prior art. It is intended, in particular, to provide a printed circuit board arrangement with which a large number of conductor tracks accommodated in a flexible portion can be contacted on a surface area which is as small as possible.

This object is achieved by the improvement in a printed circuit board arrangement with a flexible layer arrangement, in which at least one electrically conductive layer with a large number of conductor tracks lying next to one another is accommodated and surrounded by electrically isolating layers, the flexible layer arrangement being firmly connected in portions to at least one printed circuit board suitable for accommodating a component and for forming a fixed portion, and an opening extending as far as the conductor tracks being provided in the region of the fixed portion. The improvements are that the opening passes through the printed circuit board to enable contacting of the conductor tracks with the component on the circuit board. This is particularly important when the flexible layer arrangement has a plurality of electrically conductive layers arranged one on top of the other and separated from one another by electrical isolating layers and the opening is formed in a step-like manner so that the conductor tracks of each layer can be contacted.

According to the invention, it is provided that, for the contacting of the conductor tracks with the component, the opening passes through the printed circuit board. The provision of the opening or recess passing through the printed circuit board permits direct contacting of the component with the conductor tracks. The contacting may take place, for example, by means of a conventional bonding technique. This advantageously achieves the effect that a large number of conductor tracks can be contacted on a relatively small surface area or in a small space. The shielding problems occurring when a large number of conventional plated through-holes are produced are avoided.

The proposed printed circuit board arrangement is suitable, in particular, for use for the production of detector modules for an X-ray computer tomograph.

Other advantages and features of the invention will be readily apparent from the following description of the preferred embodiments, the drawings and claims.

BRIEF DESCRIPTION OF THE DRAWINGS

FIG. 2 is a partial cross-sectional view of a printed circuit board arrangement according to FIG. 1; and FIG. 3 is a partial cross-sectional view of an embodiment of the printed circuit board arrangement of FIG. 1.

DESCRIPTION OF THE PREFERRED EMBODIMENTS

Figure 1:
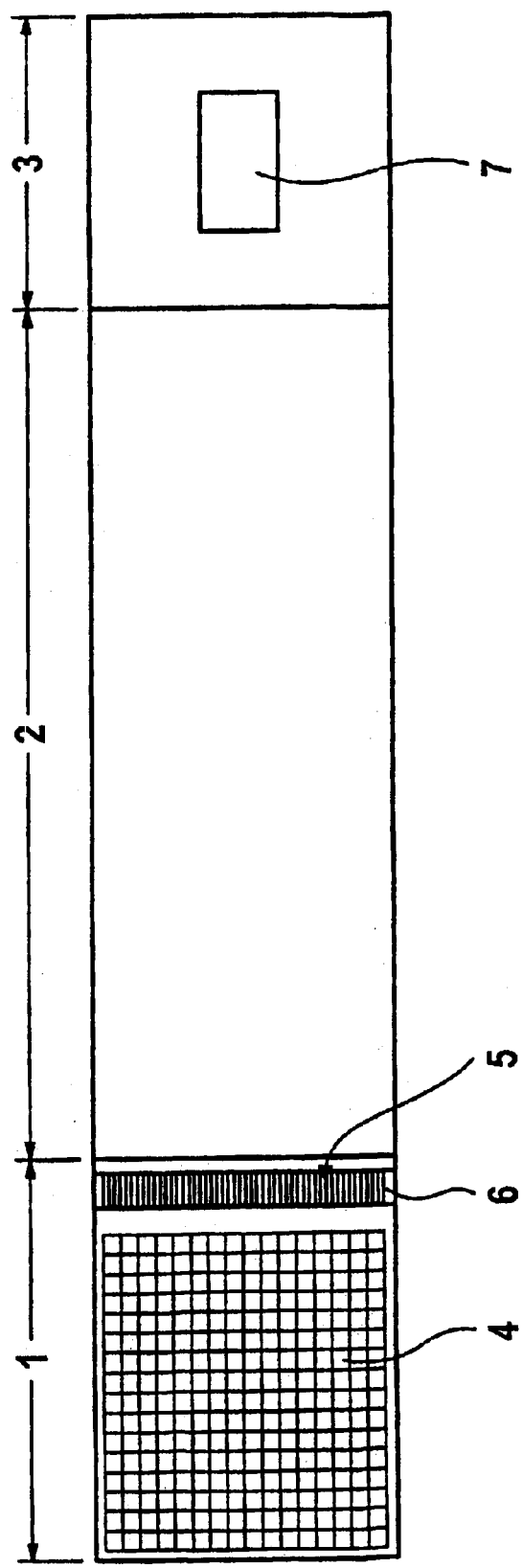
FIG. 1 is a plan view of a printed circuit board arrangement according to the present invention.

The principles of the present invention are particularly useful when incorporated in a printed circuit board arrangement illustrated in FIG. 1. The arrangement has a first fixed portion 1, which is movably connected to a second fixed portion 3 by a flexible layer arrangement 2. Accommodated on the first fixed portion 1 is a component, for example a photodiode array 4, formed by 16×16 photodiodes. The first fixed portion 1 and the second fixed portion 3 are formed by adhesively attaching a conventional printed circuit board onto the flexible layer arrangement 2. An opening 5 provided in the first fixed portion 1 passes through the printed circuit board and extends into the flexible layer arrangement at least as far as a layer formed therein by a large number of conductor tracks 6 lying next to one another. The conductor tracks 6 extend as far as the second fixed portion 3. There, a connector 7 is mounted on another printed circuit board. The contacts of the connector 7 are connected to the conductor tracks 6 (not shown here) by means of conventional plated through-holes. However, it is also possible to contact the contacts of the connector 7 directly with the conductor tracks 6 by means of another opening.

As shown in FIG. 2, the printed circuit board arrangement has a flexible layer arrangement 2, which is formed by a layer formed by a plurality of conductor tracks 6 lying next to one another. This layer of conductor tracks 6 is electrically isolated from the surroundings by interposing and surrounding it with electrically isolating layers 11. The electrically isolating layers 11 may be produced, for example, from a polyamide, and the conductor tracks 6 may be produced in a conventional way from copper, silver or other conductive materials. For forming a fixed portion of the printed circuit board arrangement, the flexible layer arrangement 2 is firmly connected, for example, by means of adhesive bonding, on both sides to conventional printed circuit boards 8. The printed circuit boards 8, respectively, have, on their outer surface, facing the surroundings, a metallization 9, serving for shielding purposes. The metallizations 9 of the printed circuit boards 8 are interconnected in an electrically conducting manner by means of a conventional plated through-hole 10. The metallizations 9 are covered in a conventional way by an electrically isolating coating (not shown here). The component, for example the photodiode array 4, is mounted on a first side of the printed circuit board 8, which lies opposite a second side of the printed circuit board, which is in contact with the flexible arrangement 2. This permits the contacting of the component with the conductor tracks 6 in a particularly simple way by means of a bonding technique.

The opening 5 passes through the printed circuit board 8 and the uppermost electrically isolating layer 11 of the flexible layer arrangement 2, which layer 11 is located directly under the circuit board 8. The opening extends as far as the conductor tracks 6 accommodated in the flexible layer arrangement 2. The conductor tracks 6 are connected in an electrically conducting manner directly to the photodiode array 4 by means of a contacting link or wire 12. In this case, the contacting link passes through the opening or clearance 5 formed in the printed circuit board 8. The contacting links 12 are expediently produced by means of a bonding technique. The opening or clearance 5 may be filled with an electrically isolating casting compound 13 after the contacting links 12 have been produced.

In the case of the exemplary embodiment shown in FIG. 3, the opening or clearance 5 is formed in a step-shaped manner, in particular in the region of the layer arrangement 2. This special form of the clearance 5 allows a plurality of layers of conductor tracks 6 lying one on top of the other to be contacted directly by means of the bonding technique.

The layers accommodated in the layer arrangement 2 may have a thickness in the range of 50 μm to 500 μm. The printed circuit board used for producing the fixed portions 1 and 3 may be of a conventional printed circuit board material, for example FR4.

According to another refinement (not represented in the drawings), a metal layer has been applied on the upper surface of the printed circuit board 8 on the component side. If a photodiode array is used as the component, one of the contacts of each photodiode may be connected to the metal layer, which is grounded. The other contact may then be connected directly by means of the bonding technique to the conductor track 6 exposed in the opening 5.

The opening 5 does not necessarily have to be provided in the region of the printed circuit board 8. It is also conceivable to mount the component 4 in the vicinity of one end of the fixed portion 1 or 3. In this case, the opening may be provided in the flexible layer arrangement 2. The contacting link 12 is, in this case, routed from the component 4 mounted on the fixed portion to the opening 5, which is provided in the flexible layer arrangement 2 in the vicinity of the fixed portion 1 or 3.

Although various minor modifications may be suggested by those versed in the art, it should be understood that we wish to embody within the scope of the patent granted hereon all such modifications as reasonably and properly come within the scope of our contribution to the art.

We claim:

1. A printed circuit board arrangement having at least a first fixed portion, a second fixed portion, a movable flexible layer arrangement extending from the first fixed portion to the second fixed portion, said movable flexible layer arrangement having at least one electrically conductive layer with a multitude of conductor tracks lying next to one another being accommodated and surrounded by electrically isolating layers, the flexible layer arrangement being firmly connected in portions to at least one printed circuit board suitable for accommodating a component for forming the first fixed portion, and an opening passing through the printed circuit board and extending as far as the conductor tracks being in the region of the first fixed portion to enable contacting the conductor tracks with the component.

2. A printed circuit board arrangement according to claim 1, which has a plurality of electrically conductive layers being arranged one on top of the other and being separated from one another by electrically isolating layers in the flexible layer arrangement.

3. A printed circuit board arrangement according to claim 1, wherein an electrically conductive layer situated closest to the surface of the flexible layer arrangement is formed as a shielding layer.

4. A printed circuit board arrangement according to claim 1, wherein the electrically isolating layers are produced from a polyamide.

5. A printed circuit board arrangement according to claim 1, wherein the component has a multitude of photodiodes.

6. A printed circuit board arrangement according to claim 1, wherein the component on the at least one printed circuit board is a detector module for an X-ray computer tomograph.

7. A printed circuit board arrangement according to claim 1, wherein the opening, after forming the connection, is filled with a casting compound.

8. A printed circuit board arrangement according to claim 1, which includes a metal layer being applied on the first fixed portion and a contact of the component being connected to the metal layer and another contact of the component being connected to the conductor track by means of a bonding technique.

9. A printed circuit board arrangement according to claim 2, wherein the opening being formed is in a step-like manner so that the conductor tracks of more than one layer can be contacted.

10. A printed circuit board arrangement according to claim 5, wherein the first fixed portion has a metal layer and one of the two contacts of each of the photodiodes is respectively connected to the metal layer.

11. A printed circuit board arrangement according to claim 7, wherein the casting compound is a plastic.

12. A printed circuit board arrangement according to claim 10, wherein the other contact of each photodiode is connected to a conductor track provided for this purpose.

13. A printed circuit board arrangement according to claim 12, wherein a connection of the other contact to the conductor track is by means of a bonding technique directly between the other contact and the conductor track.

14. A printed circuit board arrangement according to claim 13, wherein the opening, after forming the electrical connections, is filled with a casting compound.

15. A printed circuit board arrangement according to claim 14, wherein the casting compound is a plastic.

* * * * *